US008525309B2

(12) United States Patent
Chia et al.

(10) Patent No.: US 8,525,309 B2
(45) Date of Patent: Sep. 3, 2013

(54) FLIP-CHIP QFN STRUCTURE USING ETCHED LEAD FRAME

(75) Inventors: Chok Chia, Cupertino, CA (US); Qwai Low, Cupertino, CA (US); Kishor Desai, Fremont, CA (US); Charles G. Woychik, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 49 days.

(21) Appl. No.: 13/173,883

(22) Filed: Jun. 30, 2011

(65) Prior Publication Data

US 2013/0001757 A1    Jan. 3, 2013

(51) Int. Cl.
| | |
|---|---|
| *H01L 23/495* | (2006.01) |
| *H01L 21/50* | (2006.01) |
| *H01L 23/34* | (2006.01) |
| *H01L 21/60* | (2006.01) |
| *H01R 43/16* | (2006.01) |

(52) U.S. Cl.
USPC .......... 257/675; 257/676; 257/E23.031; 257/E23.08; 257/E21.499; 257/E21.506; 438/107; 438/122; 438/123; 29/874

(58) Field of Classification Search
USPC .......... 257/666, 672, 675, 676, E33.066, 257/E23.039, E23.031, E23.08, E21.499, 257/E21.506; 438/123, 122, 107; 29/874
See application file for complete search history.

(56) References Cited

U.S. PATENT DOCUMENTS

| | | | | |
|---|---|---|---|---|
| 2005/0189635 | A1* | 9/2005 | Humpston et al. | 257/678 |
| 2006/0220241 | A1* | 10/2006 | Thornton et al. | 257/734 |
| 2007/0114641 | A1* | 5/2007 | Goh et al. | 257/676 |
| 2007/0298603 | A1* | 12/2007 | Rebibis et al. | 438/613 |

* cited by examiner

*Primary Examiner* — Victor A Mandala
*Assistant Examiner* — Whitney T Moore
(74) *Attorney, Agent, or Firm* — Lerner, David, Littenberg, Krumholz & Mentlik, LLP

(57) ABSTRACT

A microelectronic unit can include a lead frame and a device chip. The lead frame can have a plurality of monolithic lead fingers extending in a plane of the lead frame. Each lead finger can have a fan-out portion and a chip connection portion extending in the lead frame plane. The fan-out portions can have first and second opposed surfaces and a first thickness in a first direction between the opposed surfaces. The chip connection portions can have a second thickness smaller than the first thickness. The chip connection portions can define a recess below the first surface. The device chip can have a plurality of at least one of passive devices or active devices. The device chip can have contacts thereon facing the chip connection portions and electrically coupled thereto. At least a portion of a thickness of the device chip can extend within the recess.

53 Claims, 13 Drawing Sheets

FLIP-CHIP QFN STRUCTURE USING ETCHED LEAD FRAME

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself.

As used in this disclosure with reference to a flat chip having a front face, the "area of the chip" should be understood as referring to the area of the front face. In "flip chip" designs, the front face of the chip confronts the face of a package substrate, i.e., the chip carrier, and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low overall height or dimension perpendicular to the plane of the circuit panel. Such thin microelectronic packages allow for placement of a circuit panel having the packages mounted therein in close proximity to neighboring structures, thus reducing the overall size of the product incorporating the circuit panel.

Various proposals have been advanced for providing plural chips in a single package or module. For example, it has been proposed to package plural chips in a "stack" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148,265; and 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite the advances that have been made in multi-chip packages, there is still a need for improvements in order to minimize the size and improve the performance of such packages. These attributes of the present invention are achieved by the construction of the microelectronic assemblies as described hereinafter.

BRIEF SUMMARY OF TEE INVENTION

In accordance with an aspect of the invention, a microelectronic unit can include a lead frame and a device chip. The lead frame can have a plurality of monolithic lead fingers extending in a plane of the lead frame. Each lead finger can have a fan-out portion and a chip connection portion. Each fan-out portion can extend in the lead frame plane. The fan-out portions can have first and second opposed surfaces and a first thickness in a first direction between the opposed surfaces. Each chip connection portion can extend in the lead frame plane. The chip connection portions can have a second thickness smaller than the first thickness. The chip connection portions can define a recess below the first surface. The device chip can have a plurality of at least one of passive devices or active devices. The device chip can have contacts thereon facing the chip connection portions and electrically coupled thereto. At least a portion of a thickness of the device chip can extend within the recess.

In a particular embodiment, each chip connection portion can have a first width in a second direction substantially parallel to the lead frame plane and each fan-out portion can have a second width in the second direction, the first width being less than the second width. In one embodiment, the device chip can embody a plurality of active semiconductor devices therein. In an exemplary embodiment, the device chip can have a plurality of passive devices, the passive devices including at least one of capacitors, inductors, or resistors. In a particular embodiment, the fan-out portions can be disposed beyond an exterior periphery of the device chip. In one embodiment, the entire thickness of the device chip can extend within the recess. In an exemplary embodiment, a rear surface of the device chip can be exposed at an exterior surface of the microelectronic unit. In a particular embodiment, the microelectronic unit can also include an encapsulant covering the chip connection portions and at least a portion of the device chip.

In one embodiment, the contacts of the device chip can be joined to the chip connection portions by metal pillars extending therebetween. In an exemplary embodiment, the contacts of the device chip can be joined to the chip connection portions by solder extending therebetween. In a particular embodiment, the contacts of the device chip can be joined to the chip connection portions by a conductive matrix material extending therebetween. In one embodiment, the microelectronic unit can also include a heat spreader element in thermally conductive contact with at least one of the device chip and the lead frame. In an exemplary embodiment, the heat spreader element can be in thermally conductive contact with the device chip. In a particular embodiment, the heat spreader element can overlie the device chip and can be disposed adjacent the device chip. In one embodiment, the microelectronic unit can also include a heat spreader connector element disposed beyond an exterior periphery of the device chip.

In an exemplary embodiment, the device chip can be a first device chip. The microelectronic unit can also include a second device chip adjacent to and electrically coupled with the first device chip through electrical interconnections extending at least one of along or within the first and second device chips. At least a portion of a thickness of the second device chip can extend within the recess. In a particular embodiment, the device chip can be a first device chip. The microelectronic unit can also include a second device chip overlying and electrically coupled with the first device chip through electrical interconnections extending at least one of along or within the first and second device chips. In one embodiment, the first chip can entirely overlie the second chip. In an exemplary embodiment, a peripheral edge of the first chip can be offset from a peripheral edge of the second chip.

In a particular embodiment, the recess can be a first recess. The chip connection portions can also define a second recess below the second surface. At least a portion of a thickness of the second device chip can extend within the second recess. In one embodiment, the microelectronic unit can also include a third device chip adjacent to the first device chip and overlying at least a portion of the second device chip. At least a portion of a thickness of the third device chip can extend within the first recess. In an exemplary embodiment, some of the chip connection portions can be joined with the contacts of the first device chip and some of the chip connection portions can be joined with contacts of the second device chip. In a particular embodiment, some of the chip connection portions can be joined with the contacts of both the first and second device chips.

In one embodiment, the chip connection portions that are joined with the contacts of the first device chip can be longer than the chip connection portions that are joined with the contacts of the second device chip. In an exemplary embodiment, connections between the contacts of the first and second device chips and the chip connection portions can be offset in a second direction in which the chip connection portions extend towards the respective fan-out portions. In a particular embodiment, the microelectronic unit can also include a heat spreader element in thermally conductive contact with at least one of the first and second device chips.

In an exemplary embodiment, a microelectronic assembly can include first and second microelectronic units, each microelectronic unit as described above. The first microelectronic unit can be electrically connected with and can at least partially overlie the second microelectronic unit. In one embodiment, the fan-out portions of the lead fingers connected to the first microelectronic unit can be joined to the fan-out portions of the lead fingers connected to the second microelectronic unit. In a particular embodiment, the microelectronic assembly can also include a heat spreader element disposed between the second device chip of the first microelectronic unit and the first device chip of the second microelectronic unit. In an exemplary embodiment, the microelectronic assembly can also include an encapsulant covering the chip connection portions and at least portions of the device chips of the first and second microelectronic units.

Further aspects of the invention can provide systems that incorporate microelectronic units and/or microelectronic assemblies according to the foregoing aspects of the invention, composite chips according to the foregoing aspects of the invention, or both in conjunction with other electronic components electrically connected thereto. For example, the system can be disposed in and/or mounted to a single housing, which can be a portable housing. Systems according to preferred embodiments in this aspect of the invention can be more compact than comparable conventional systems.

In accordance with another aspect of the invention, a lead frame can include a plurality of monolithic lead fingers extending in a plane of the lead frame. Each lead finger can have a fan-out portion and a chip connection portion. Each fan-out portion can extend in the lead frame plane. The fan-out portions can have first and second opposed surfaces and a first thickness in a first direction between the opposed surfaces. Each chip connection portion can extend in the lead frame plane. The chip connection portions can have a second thickness smaller than the first thickness. The chip connection portions can define a recess below the first surface.

In a particular embodiment, each chip connection portion can have a first width in a second direction substantially parallel to the lead frame plane and each fan-out portion can have a second width in the second direction, the first width being less than the second width. In one embodiment, the chip connection portions can have bumps integral therewith projecting in the first direction from the chip connection portions.

In accordance with yet another aspect of the invention, a method of fabricating a lead frame can include removing material from a metal element to form a plurality of monolithic lead fingers extending in a plane of the metal element. The lead fingers can have fan-out portions and chip connection portions extending from the fan-out portions. The fan-out portions can have first and second opposed surfaces and a first thickness in a first direction between the opposed surfaces. The chip connection portions can have a second thickness in the first direction. The second thickness can be smaller than the first thickness and can define a first recess below the first surface.

In one embodiment, the step of removing material can include removing material from the first surface to define locations of the lead fingers, and further removing material from the metal element to define the fan-out portions at the defined lead finger locations and to define the chip connection portions. In an exemplary embodiment, the step of removing material can form the chip connection portions having bumps integral therewith projecting in the first direction from the chip connection portions. In a particular embodiment, the method can also include plating a metal onto the bumps for joining with conductive contacts of a device chip. The metal can be selected from the group consisting of: gold, nickel, palladium, tin, or an alloy of any of these metals.

In accordance with still another aspect of the invention, a method of fabricating a microelectronic unit can include joining contacts of a device chip with chip connection portions of lead fingers of a lead frame. The device chip can have a plurality of at least one of passive devices or active devices. The contacts of the device chip can face the chip connection portions. At least a portion of a thickness of the device chip can extend within a recess defined by the chip connection portions. The lead fingers can also include fan-out portions extending in a lead frame plane from the chip connection portions. The fan-out portions can have first and second opposed surfaces. The fan-out portions can have a first thickness in a first direction between the opposed surfaces. The chip connection portions can have a second thickness in the first direction smaller than the first thickness.

In an exemplary embodiment, each chip connection portion can have a first width in a second direction substantially parallel to the lead frame plane and each fan-out portion can have a second width in the second direction, the first width being less than the second width. In a particular embodiment, the fan-out portions can be disposed beyond an exterior periphery of the device chip. In one embodiment, the entire thickness of the device chip can extend within the first recess. In an exemplary embodiment, a rear surface of the device chip can be exposed at an exterior surface of the microelectronic unit. In a particular embodiment, the method can also include depositing an encapsulant covering the chip connection portions of the lead fingers and at least a portion of the device chip.

In a particular embodiment, the step of joining the contacts of the first device chip with the chip connection portions can be performed by thermosonic bonding of the chip connection portions to metal pillars extending from the contacts of the first device chip. In one embodiment, the step of joining contacts of the first device chip with the chip connection portions can be performed by curing a conductive matrix material extending between the contacts and the chip connection portions. In an exemplary embodiment, the method can also include joining a heat spreader element to the device chip with a thermally conductive material. The heat spreader element can at least partially overlie the device chip.

In one embodiment, the device chip can be a first device chip. The method can also include joining contacts of a second device chip with chip connection portions of lead fingers of the lead frame. In a particular embodiment, the first and second device chips can be adjacent one another. At least a portion of a thickness of the second device chip can extend within the recess. In an exemplary embodiment, the recess can be a first recess. The chip connection portions can also define a second recess. At least a portion of a thickness of the second device chip can extend within the second recess. In one embodiment, a peripheral edge of the first chip can be offset from a peripheral edge of the second chip. In a particular embodiment, connections between the contacts of the first and second device chips and the chip connection portions can be offset in a direction in which the chip connection portions extend towards the respective fan-out portions.

In an exemplary embodiment, some of the chip connection portions can be joined with the contacts of the first device chip and some of the chip connection portions can be joined with contacts of the second device chip. In one embodiment, some of the chip connection portions can be joined with the contacts of both the first and second device chips. In a particular embodiment, a method of fabricating a microelectronic assembly can include joining first and second microelectronic units as described above. The first microelectronic unit can be electrically connected with and can at least partially overlie the second microelectronic unit. In an exemplary embodiment, the method can also include depositing an encapsulant covering the chip connection portions and at least portions of the device chips of the first and second microelectronic units. In one embodiment, a method of fabricating a microelectronic assembly can include joining the fan-out portions of a microelectronic unit as described above with corresponding contacts of at least a first component confronting the first surface of the lead frame.

DETAILED DESCRIPTION

Figure 1A:
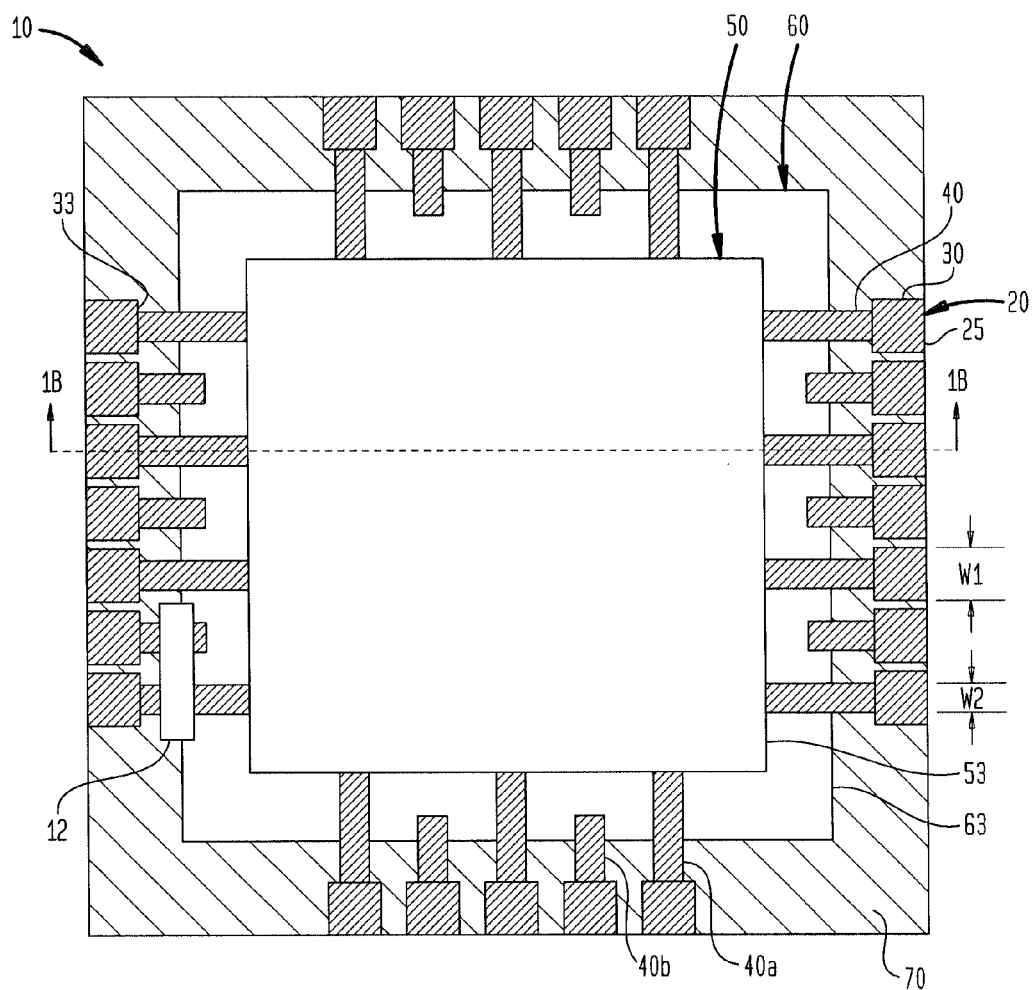
FIG. 1A is a diagrammatic top view of a stacked microelectronic unit according to an embodiment of the present invention.
Figure 1B:
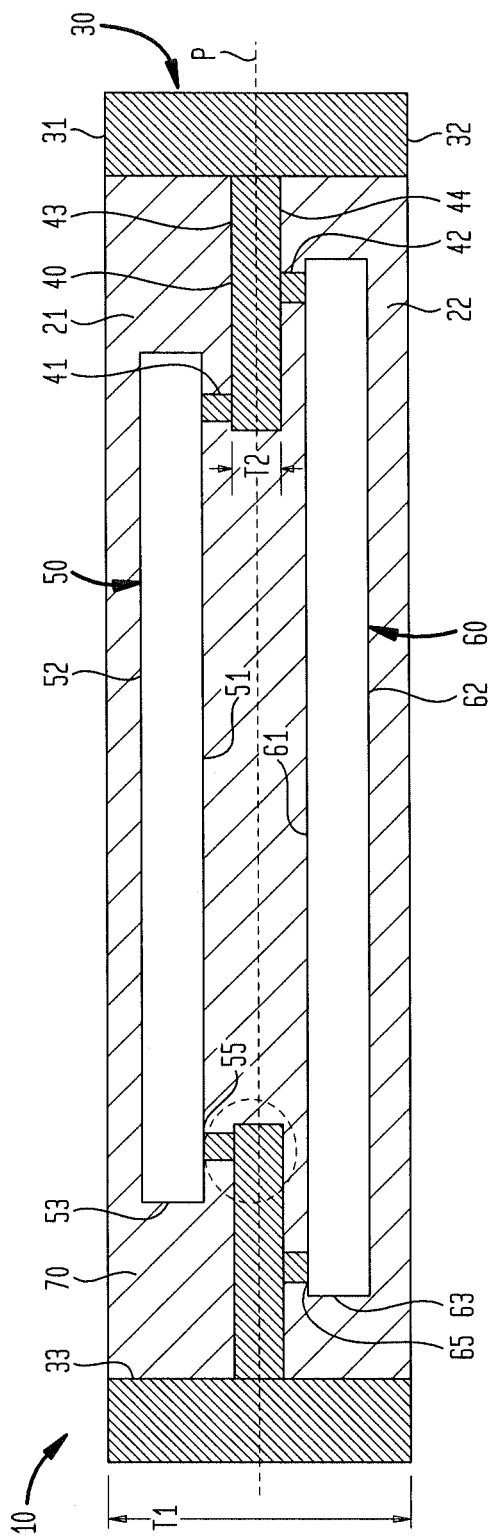
FIG. 1B is a diagrammatic side sectional view of the microelectronic unit of FIG. 1A, taken along the line 1B-1B of FIG. 1A.

With reference to FIGS. 1A and 1B, a microelectronic unit 10 according to an embodiment of the present invention can include a lead frame 20 having a plurality of monolithic lead fingers 25 extending in a plane P of the lead frame, each lead finger having a fan-out portion 30 and a chip connection portion 40. First and second device chips 50 and 60 can be electrically coupled to the lead frame 20. An encapsulant 70 can cover the device chips 50 and 60 and a portion of the lead fingers 25.

Examples of lead frame structures are shown and described in U.S. Pat. Nos. 7,176,506 and 6,765,287, the disclosures of which are hereby incorporated by reference herein. In general, a lead frame such as the lead frame 20 is a structure formed from a sheet of conductive metal, such as copper, that is patterned into segments including a plurality of lead fingers 25. The lead fingers 25 can then be used to form electrical connections to various other conductive structures for carrying an electronic signal potential to and from the device chips 50 and 60. In one example, the lead fingers 25 can be usable to carry an address signal usable to address a memory storage element in at least one of the first and device chips 50 and 60.

Each fan-out portion 30 extends in the lead frame plane P. The fan-out portions 30 have first and second opposed surfaces 31 and 32 and a first thickness T1 in a first direction between the opposed surfaces. Each fan-out portion 30 has a first width W1 in a second direction substantially parallel to the lead frame plane P. As used herein, "parallel" refers to axes extending through the structures' centroids being parallel or substantially parallel within an allowed tolerance, even if edges of the "parallel" structures are not entirely parallel.

The fan-out portions 30 can include electrically conductive terminals (not shown) exposed at one or more of the first and second surface 31 and 32 for electrical interconnection with an external component such as a package substrate or a PCB.

In FIGS. 1A and 1B, the directions parallel to the first surface 31 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

Each chip connection portion 40 extends in the lead frame plane P from a corresponding fan-out portion 30. The chip connection portions 40 have a second thickness T2 in the first direction smaller than the first thickness T1. The chip connection portions 40 have a second width W2 in the second direction smaller than the first width W1. The chip connection portions 40 define a first recess 21 below the first surface 31 of the fan-out portions 30 and a second recess 22 below the second surface 32 of the fan-out portions.

The device chips 50 and 60 can each be a semiconductor chip, a wafer, or the like. For example, one or both of the first microelectronic element 20 and the second microelectronic element 30 can include a memory storage element such as a DRAM. As used herein, a "memory storage element" refers to a multiplicity of memory cells arranged in an array, together with circuitry usable to store and retrieve data therefrom, such as for transport of the data over an electrical interface.

Each of the device chips 50 and 60 can be a device chip having a plurality of at least one of passive devices or active devices. In one example, one or both of the device chips 50 and 60 can embody a plurality of active semiconductor devices therein. In another example, one or both of the device chips 50 and 60 can have a plurality of passive devices, the passive devices including at least one of capacitors, inductors, or resistors.

Each of the device chips 50 and 60 can include respective electrically conductive contacts 55 and 65 exposed at the respective front surfaces 51 and 61 thereof. As described herein, the electrically conductive contacts 55 and 65 of the first and second device chips 50 and 60 can also be referred to as "chip contacts." As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure.

Figure 14:
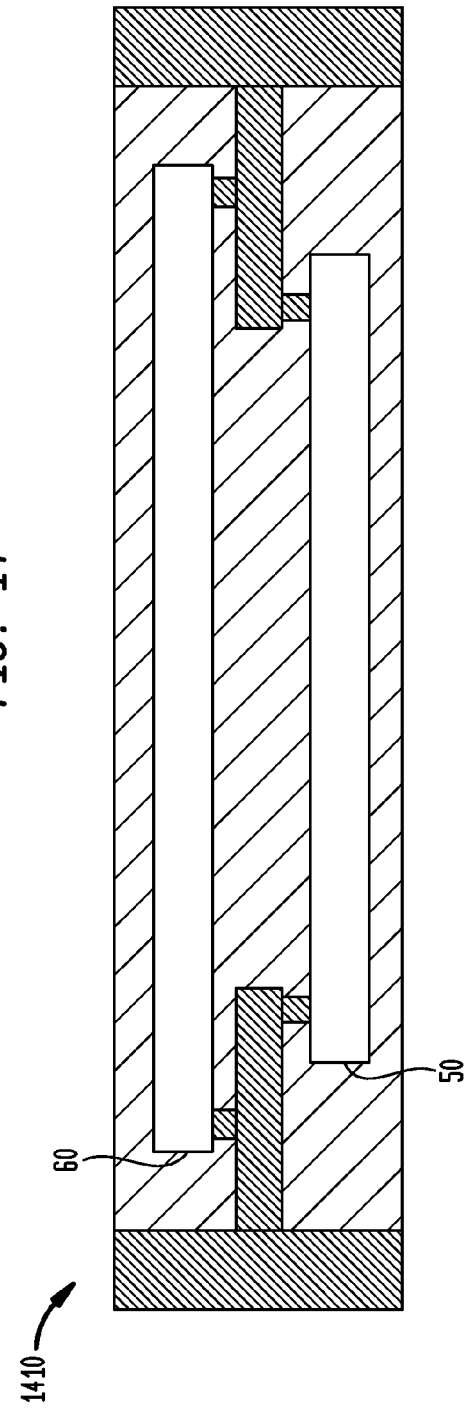
FIG. 14 is a diagrammatic side sectional view of a variation of the microelectronic unit of FIG. 1B.

In a particular example, the first device chip 50 can overlie and can be electrically coupled with the second device chip 60 through electrical interconnections extending at least one of along or within the first and second device chips. In one embodiment, the first device chip 50 can entirely overlie the second chip 60. In an exemplary embodiment, at least one peripheral edge 53 of the first device chip 50 can be offset in the lead frame plane P from a corresponding peripheral edge 63 of the second device chip 60. In a variation of FIG. 1B, shown in FIG. 14, a microelectronic unit 1410 can have a second device chip 60 that can entirely overlie the first device chip 50.

As seen in FIGS. 1A and 1B, the first and second device chips 50 and 60 can be stacked relative to one another. In some embodiments, the front surface 51 of the first device chip 50 and the front surface 61 of the second device chip 60 can face one another. At least a portion of the front surface 51 of the first device chip 50 can overlie at least a portion of the front surface 61 of the second device chip 60. At least a portion of the second device chip 60 can project beyond a lateral edge 53 of the first device chip 50. Accordingly, the contacts 65 of the second device chip 60 can be positioned in a location projecting beyond the lateral edge 53 of the first device chip 50.

The contacts 55 and 65 of the first and second device chips 50 and 60 can be exposed at the front surfaces 51 and 61 adjacent respective peripheral edges 53 and 63. For example, the contacts 55 and 65 can be arranged in one or two parallel rows adjacent the peripheral edges 53 and 63 of the front surfaces 51 and 61.

In example embodiments, the first and second device chips 50 and 60 can be flip-chip bonded directly onto the chip connection portions 40 of the lead fingers 25, which can extend under the front surfaces 51 and 61 of the first and second device chips. In such an embodiment, the contacts 55 and 65 on the first and second device chips 50 and 60 can be electrically connected to the chip connection portions 40 through respective bumps 41 and 42 extending from the respective top surface 43 and bottom surface 44 of the chip connection portions. In an alternative embodiment, the bumps 41 and 42 can extend from the respective contacts 55 and 65 of the first and second device chips 50 and 60.

In one embodiment, the contacts 55 of the first device chip 50 can be joined with some of the chip connection portions 40a, and the contacts 65 of the second device chip 60 can be joined with some of the chip connection portions 40b. As shown in FIG. 1A, the chip connection portions 40a that are electrically connected with the first device chip 50 can be longer and extend farther from the inner edges 33 of the fan-out portions than the chip connection portions 40b that are electrically connected with the second device chip 60.

As shown in the side sectional view in FIG. 1B, some of the chip connection portions 40 can be joined with the contacts 55 and the contacts 65 of either one or both of the first and second device chips 50 and 60 through respective bumps 41 and 42. In one example, some of the chip connection portions 40 can be joined with contacts of both the first and second device chips 50 and 60 when the device chips include memory storage elements, e.g., volatile memory such as dynamic random access memory ("DRAM") or non-volatile memory such as flash memory, among others. In an exemplary embodiment, some of the chip connection portions 40 can be joined with contacts of both the first and second device chips 50 and 60, where such shared chip connection portions can be usable to carry power or a reference potential. In all of the embodiments disclosed herein, any of the chip connection portions can be joined with a first device chip at a top surface of the chip connection portion, a second device chip at a bottom surface of the chip connection portion, or both a first and second device chip at respective top and bottom surfaces of the chip connection portion.

In a particular embodiment, connections between the contacts 55 and 65 of the first and second device chips 50 and 60 and the chip connection portions 40a and 40b can be offset in a direction in the lead frame plane P in which the chip connection portions 40a and 40b extend towards the respective fan-out portions 30.

In one example, the microelectronic unit 10 can also include a passive component 12 electrically connected between at least a first one of the connection portions 40 and a second one of the connection portions. In one embodiment, such a passive component 12 can be a decoupling capacitor extending between connection portions 40, one or more of the connection portions being usable to carry power, and one or more of the connection portions being usable to carry a reference potential.

In a particular example, the bumps 41 and 42 can be in the form of metal pillars extending from the respective chip connection portions 40a and 40b. In one example, the bumps 41 and 42 can be gold stud bumps. In one embodiment, the bumps 41 and 42 can be in the form of a conductive matrix material extending between the connection portions 40 and the respective contacts 55 and 65 of the first and second device chips 50 and 60. In one example, a metal can be plated onto the bumps 41 and 42 for joining with the conductive contacts 55 and 65 of the device chips 50 and 60, the metal selected from the group consisting of: gold, nickel, palladium, tin, or an alloy of any of these metals.

In one embodiment, the bumps 41 and 42 can include conductive masses. Such conductive masses can comprise a fusible metal having a relatively low melting temperature, e.g., solder, tin, or a eutectic mixture including a plurality of metals. Alternatively, the conductive masses can include a wettable metal, e.g., copper or other noble metal or non-noble metal having a melting temperature higher than that of solder or another fusible metal. In a particular embodiment, the conductive masses can include a conductive material interspersed in a medium, e.g., a conductive paste, e.g., metal-filled paste, solder-filled paste or isotropic conductive adhesive or anisotropic conductive adhesive.

Each of the device chips 50 and 60 is shown disposed within a corresponding recess 21 or 22. In one embodiment, at least a portion of the thickness of each device chip 50 and 60 extends within a corresponding recess 21 or 22, such that the front surface 51 and 61 of each respective device chip is disposed below the respective first and second surfaces 31 and 32. As shown in FIG. 1B, the entire thickness of each device chip 50 and 60 extends within the corresponding recess 21 or 22, such that the rear surface 52 and 62 of each respective device chip is disposed below the respective first and second surfaces 31 and 32.

In one example, the first and second recesses 21 and can be defined between inner edges 33 of the fan-out portions 30, such that the fan-out portions are disposed beyond the exterior periphery 53 and 63 of the respective device chips 50 and 60.

The encapsulant 70 can cover the device chips 50 and 60 and the chip connection portions 40 of the lead fingers 25. The encapsulant 70 can cover, for example, the rear surfaces 52 and 62 of the first and second device chips 50 and 60. In a particular embodiment, the encapsulant 70 can be an overmold. A portion of the encapsulant 70 can extend between the first and second device chips, such that the encapsulant can cover the front surfaces 51 and 61 of the first and second device chips 50 and 60.

Figure 1D:
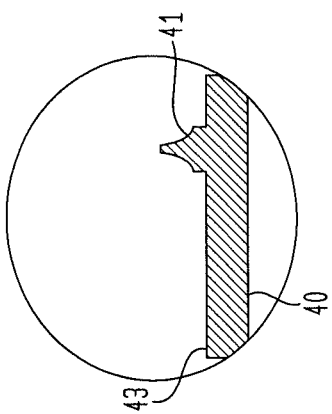
FIG. 1D is an enlarged diagrammatic side sectional view of a chip connection portion of the microelectronic unit of FIG. 1A.
Figure 1C:
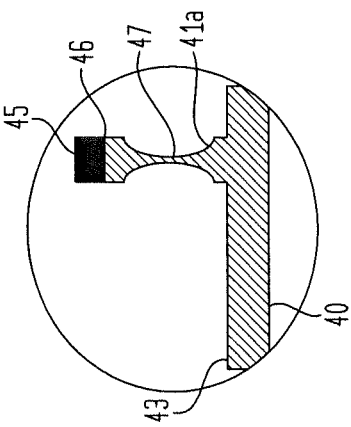
FIG. 1C is an enlarged diagrammatic side sectional view of a stage of fabrication of a chip connection portion of the microelectronic unit of FIG. 1A.
Figure 2A:
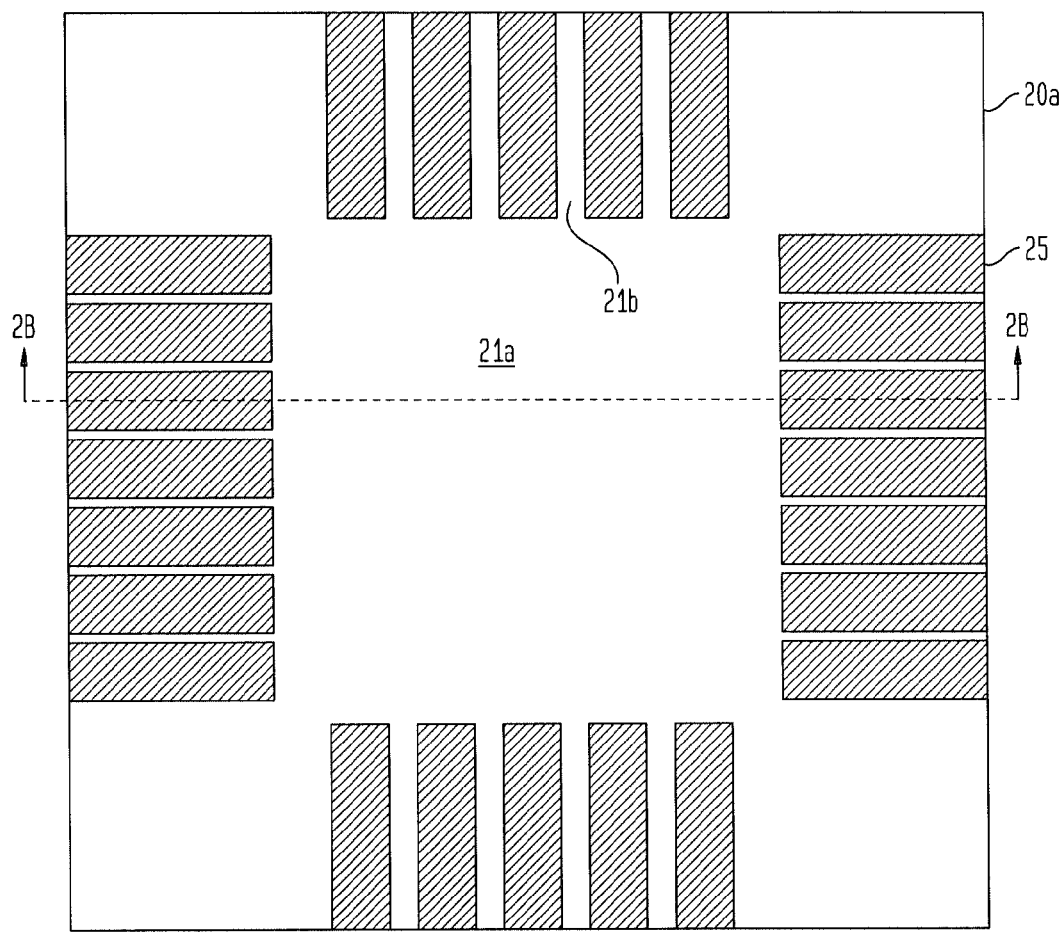
FIG. 2A is a diagrammatic top view of a stage of fabrication of the microelectronic unit of FIG. 1A.
Figure 2B:
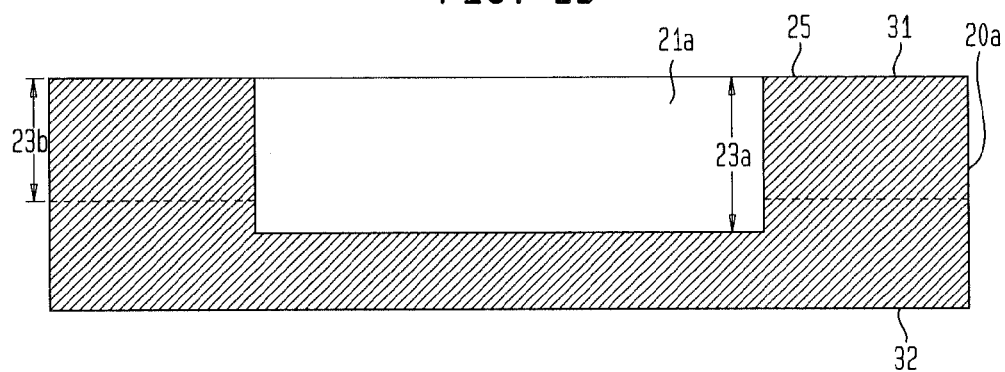
FIG. 2B is a diagrammatic side sectional view of the stage of fabrication of FIG. 2A, taken along the line 2B-2B of FIG. 2A.

A method of fabricating the microelectronic unit 10 (FIGS. 1A and 1B) will now be described, with reference to the FIGS. 1C through 5B. As shown in FIGS. 2A and 2B, a metal layer 20a can be provided. Material can be removed from the first surface 31 of the metal layer 20a to form a central opening 21a extending from the first surface towards the second surface 32 of the metal layer.

While the central opening 21a is being formed, additional material can be removed from the metal layer 20a to form a plurality of monolithic lead fingers 25 extending in a plane of the metal element. Material can be removed from between adjacent ones of the lead fingers 25 to form peripheral openings 21b extending from the first surface 31 towards the second surface 32 of the metal layer.

The central opening 21a and the peripheral openings 21b can be formed for example, by selectively etching the metal layer 20a, after forming a mask layer where it is desired to preserve remaining portions of the metal layer. For example, a photoimageable layer, e.g., a photoresist layer, can be deposited and patterned to cover only portions of the first surface 31, after which a timed etch process can be conducted to form the central opening 21a and the peripheral openings 21b. In one example, the central opening 21a can extend to a distance 23a from the first surface 31 that is farther from the first surface than a distance 23b to which the peripheral openings 21b extend.

Figure 3A:
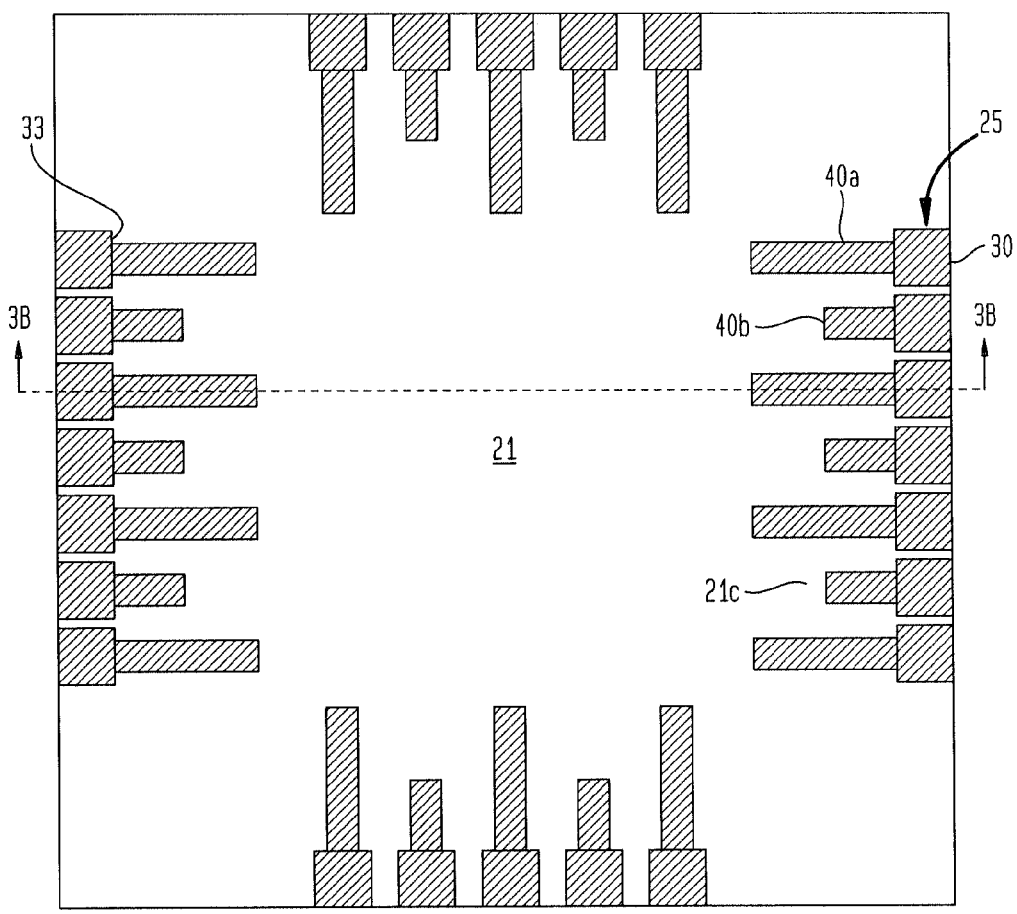
FIG. 3A is a diagrammatic top view of a stage of fabrication of the microelectronic unit of FIG. 1A.
Figure 3B:
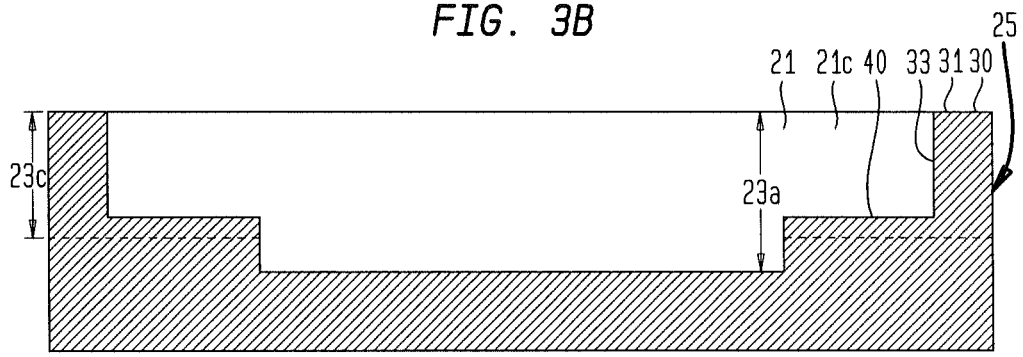
FIG. 3B is a diagrammatic side sectional view of the stage of fabrication of FIG. 3A, taken along the line 3B-3B of FIG. 3A.

Then, referring to FIGS. 3A and 3B, material can be removed from the first surface 31 of the lead fingers 25 to expand portions of the peripheral openings 21b to become peripheral openings 21c, thereby defining the fan-out portions 30 and the connection portions 40a and 40b (collectively the connection portions 40) extending from the fan-out portions. A portion of the central opening 21a and the peripheral openings 21c together form the first recess 21 extending beneath the first surface 31 and between inner surfaces 33 of the fan-out portions 30. The peripheral openings 21c can be formed using the same processes described above with respect to FIGS. 2A and 2B. In one example, the central opening 21a can extend to a distance 23a from the first surface 31 that is farther from the first surface than a distance 23c to which the peripheral openings 21c extend.

Figure 4:
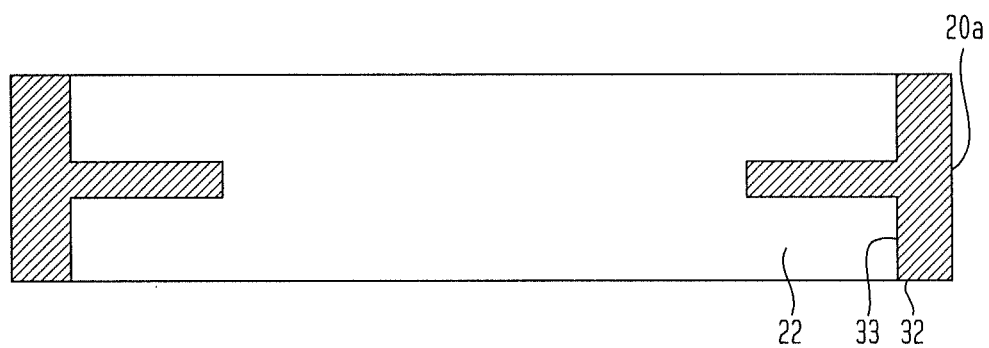
FIG. 4 is a diagrammatic side sectional view of a stage of fabrication of the microelectronic unit of FIG. 1A.

Next, referring to FIG. 4, material can be removed from the second surface 32 of the metal layer 20a to complete the formation of the plurality of lead fingers 25. Material can be removed from between adjacent ones of the lead fingers 25 to deepen the peripheral openings 21c so that they extend completely through the metal layer 20a from the first surface 31 to the second surface 32. A portion of the central opening 21a and the deepened peripheral openings 21c together form the second recess 22 extending beneath the second surface 32 and between inner surfaces 33 of the fan-out portions 30. The peripheral openings 21c can be deepened using the same processes described above with respect to FIGS. 2A and 2B.

Figure 5A:
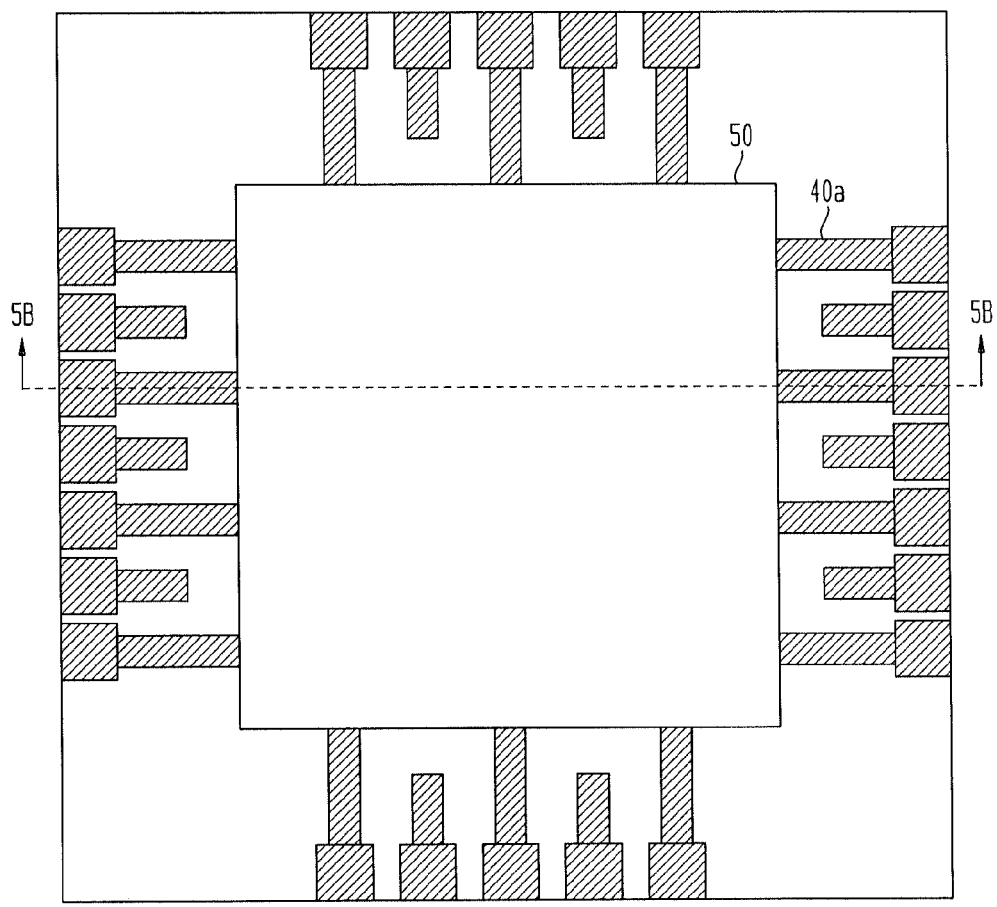
FIG. 5A is a diagrammatic top view of a stage of fabrication of the microelectronic unit of FIG. 1A.
Figure 5B:
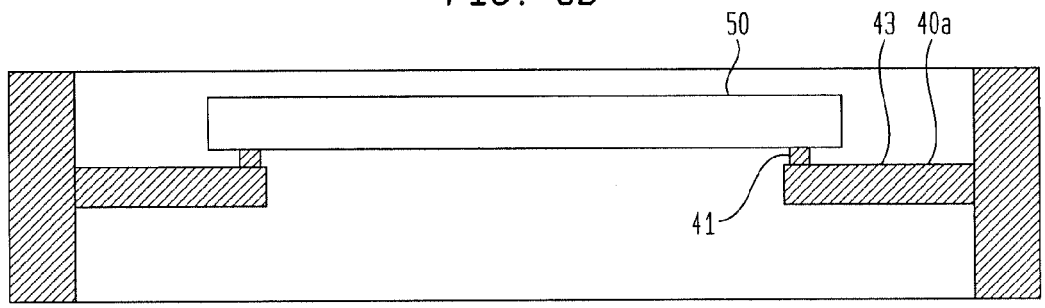
FIG. 5B is a diagrammatic side sectional view of the stage of fabrication of FIG. 5A, taken along the line 5B-5B of FIG. 5A.

Next, referring to FIGS. 5A and 5B, contacts 55 of the first device chip 50 can be joined to bumps 41 extending from a top surface 43 of the connection portions 40a. In one example, the bumps 41 can be formed as shown in FIGS. 1C and 1D. As shown in FIG. 1C, an initial bump 41a can have a photoresist 45 overlying a top surface 46 thereof. An etch process can remove material of the initial bump 41a from the side surfaces 47 thereof between the top surface 46 and the top surface 43 of the connection portions 40a. As shown in FIG. 1D, when enough material is removed from the side surfaces 47, the portion of the initial bump 41a adjacent the top surface 46 can be removed, so that the bump 41 remains.

Subsequently, referring again to FIGS. 1A and 1B, contacts 65 of the second device chip 60 can be joined to bumps 42 extending from a bottom surface 44 of the connection portions 40b. In one example, a conductive matrix material can be applied to the bumps 41 and 42 or the bumps can be in the form of by a conductive matrix material extending between the connection portions 40 and the respective contacts 55 and 65 of the first and second device chips 50 and 60. In a subsequent sintering process, the lead frame 20 can be heated to a sintering temperature in which the conductive matrix material undergoes changes which then permanently electrically and mechanically joins the contacts 55 and 65 of the first and second device chips 50 and 60 to the connection portions 40.

As deposited, i.e., before sintering, the conductive matrix material can include particles or flakes of a high melting-point material such as copper or silver, and particles or flakes a low melting-point material, such as tin, bismuth, or a combination of tin and bismuth. Some particles may have a structure which includes metal or non-metal cores, for example, polymer, silica or graphite cores, and a different metal such as a low melting-point metal thereon.

In some examples, the conductive matrix material may include a "reactive" or uncured polymer. After deposition, the structure can be subsequently heated to a temperature for sintering the conductive matrix material. During this sintering process, the high and low melting point metals fuse together, typically forming intermetallics therebetween, and forming a solid matrix of metal which can have an open cell foam-like appearance. The deposited conductive matrix material may include a medium which escapes from the metallic component thereof during the sintering process, such as by evaporation, such that the conductive matrix material may have voids therein. Alternatively, the conductive matrix material may include a reactive polymer component. Typically, the polymer component cross-links and cures as a result of the sintering process. The polymer component can become interspersed throughout the metal matrix as a result of the sintering process, the polymer material typically being connected together in open cells of the metal matrix. The metal matrix and polymer interspersed throughout may then form a solid conductive structure.

Under certain conditions, after sintering, the conductive matrix material can form a solid structure which subsequently cannot be reflowed except at a temperature substantially higher than the temperature at which the sintering process is performed. Such result may be obtained by sintering particularly when a low melting-point metal, e.g., tin or bismuth, is substantially consumed in the formation of intermetallics with at least one other metal component, of the conductive material, e.g., copper.

Depending upon the application, the temperature at which the conductive matrix material is sintered can be substantially lower than a reflow temperature at which alternative connections made of solder would need to be formed. Metals such as copper or silver can be added to solder to improve mechanical resilience and to increase the melting temperature of the solder. Thus, the structure of the bonds between the contacts 55 and 65 of the first and second device chips 50 and 60 and the connection portions 40 that have been formed with a conductive matrix material may provide a more mechanically robust system with a lower joining temperature than corresponding solder connections.

In such case, use of such conductive matrix material can help to avoid problems associated with higher temperature joining processes. For example, lower temperature joining processes achieved using a conductive matrix material can help avoid undesirable changes in substrates which include organic materials whose glass transition temperatures are relatively low. Also, lower temperature joining processes may help to address concerns during such joining processes relating to differential thermal expansion of the lead frame 20 relative to the first and second device chips 50 and 60. In this case, a lower temperature joining process can lead to improved package reliability since reduced thermal excursion during the joining process can lead to less stresses being locked into the assembled microelectronic unit 10.

In a particular example, the conductive matrix material may include a fluxing component as deposited. The fluxing component can assist in removing oxidation byproducts during the sintering process. In one embodiment, the joining process can be conducted using a conductive matrix material that does not have a fluxing component. In such case, the joining process may be performed in a low pressure, e.g., partial vacuum, environment, or one in which oxygen has been evacuated or replaced with another gas.

Thereafter, the encapsulant 70 can be injected into the recesses 21 and 22 so that the encapsulant surrounds the device chips 50 and 60 and the chip connection portions 40 of the lead fingers 25.

Figure 6:
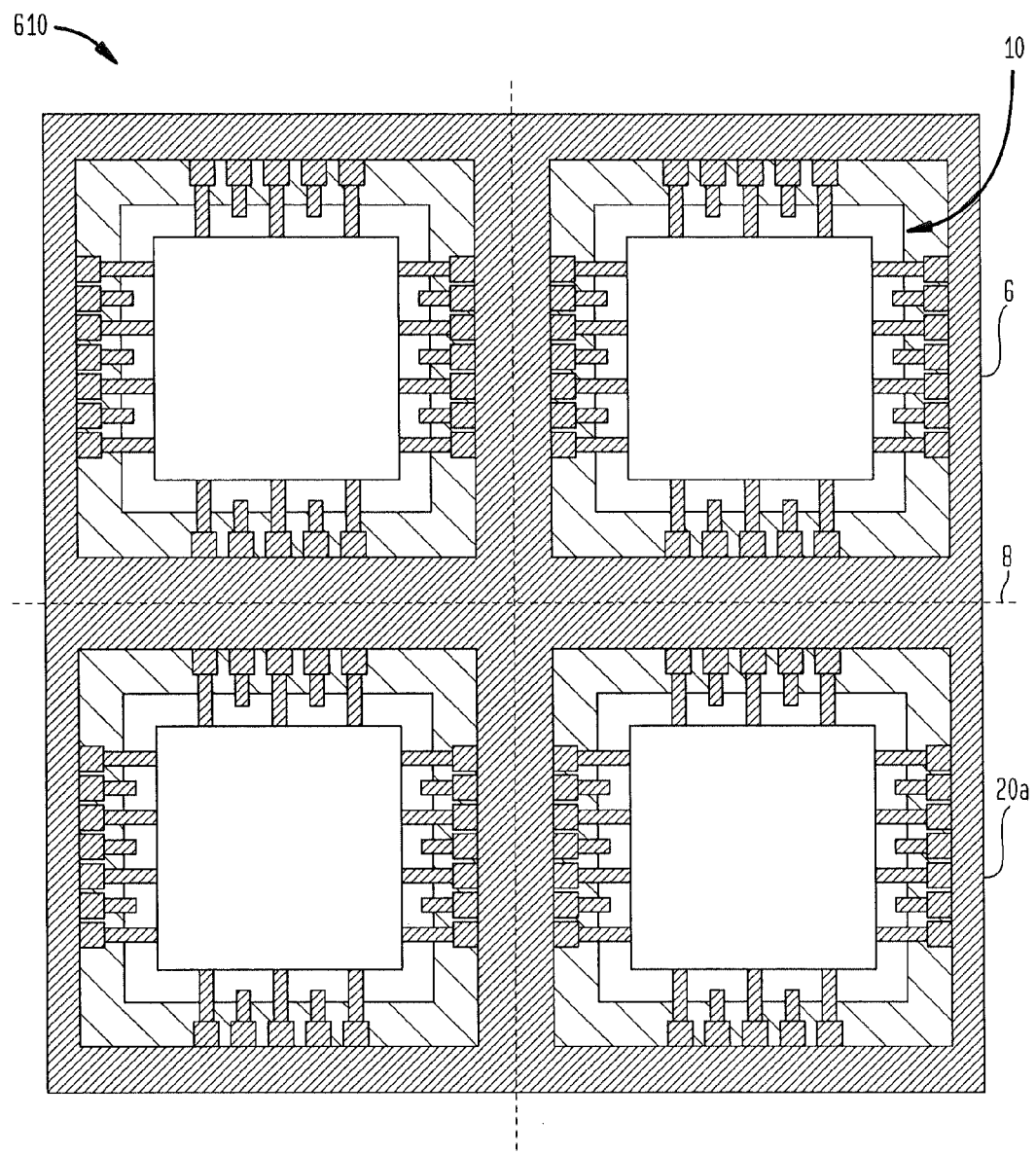
FIG. 6 is a diagrammatic top view of a stage of fabrication of the microelectronic unit of FIG. 1A, showing a plurality of microelectronic units before they are diced into individual units.

FIG. 6 shows a variation of the embodiment described above with respect to FIGS. 1A through 5B. In this variation, a module 610 includes a plurality of microelectronic units 10 as described above that are formed together using a single metal layer 20a. When the assembly of the microelectronic units 10 is complete, a temporary frame portion 6 extending between the microelectronic units 10 can be removed from the lead frames 20, and the metal layer 20a can be diced along dicing lanes 8 so as to form individual microelectronic units.

Figure 7:
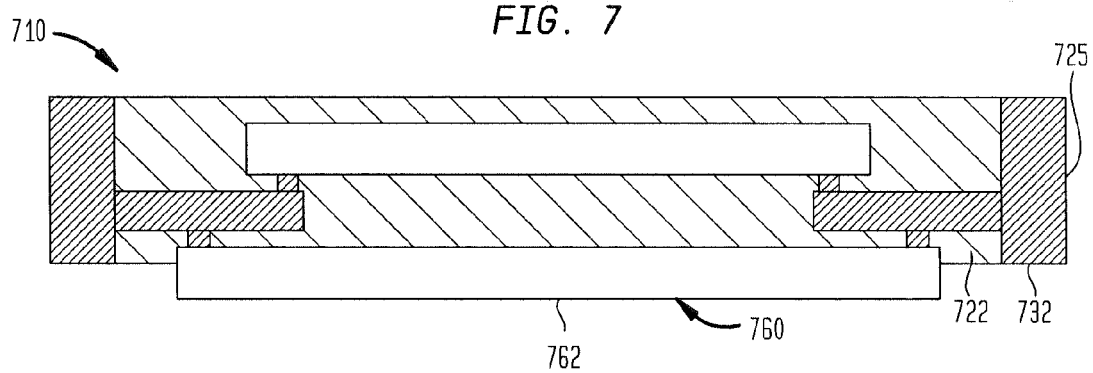
FIG. 7 is a diagrammatic side sectional view of a stacked microelectronic unit according to another embodiment.

FIG. 7 shows another variation of the embodiment described above with respect to FIGS. 1A through 5B. The microelectronic unit 710 is the same as the microelectronic unit 10 described above, except that the second device chip 760 partially extends out of the second recess 722 above the rear surface 732 of the lead fingers 725. In such an embodiment, a second surface 762 of the second device chip is exposed at an exterior surface (the second surface 732) of the microelectronic unit 710.

Figure 8:
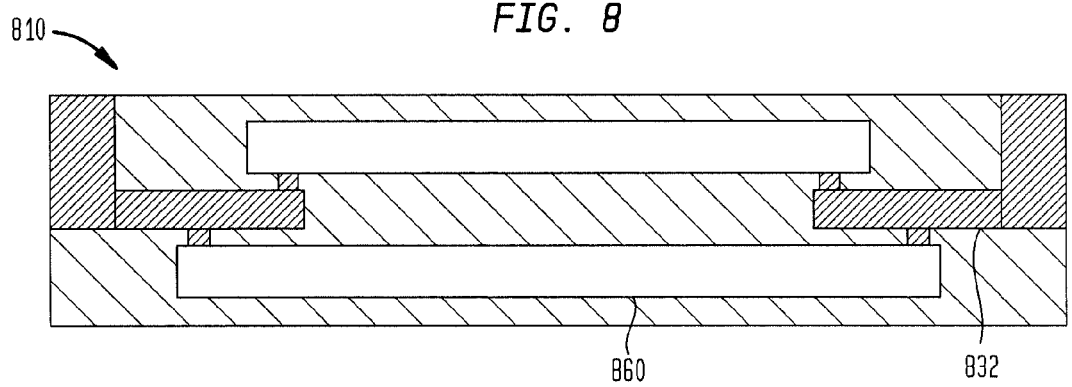
FIG. 8 is a diagrammatic side sectional view of a stacked microelectronic unit according to yet another embodiment.

FIG. 8 shows yet another variation of the embodiment described above with respect to FIGS. 1A through 5B. The microelectronic unit 810 is the same as the microelectronic unit 10 described above, except that the second device chip 860 is located above the second surface 832 of the lead fingers 825.

Figure 9:
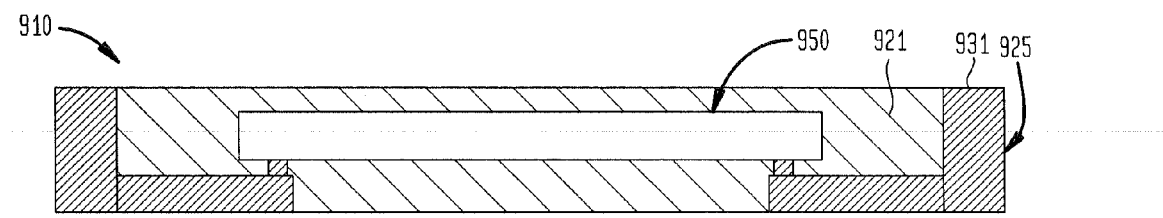
FIG. 9 is a diagrammatic side sectional view of a microelectronic unit according to still another embodiment.

FIG. 9 shows still another variation of the embodiment described above with respect to FIGS. 1A through 5B. The microelectronic unit 910 is the same as the microelectronic unit 10 described above, except that there is only a single device chip 950 disposed within a single recess 921 extending below the first surface 931 of the lead fingers 925.

Figure 10:
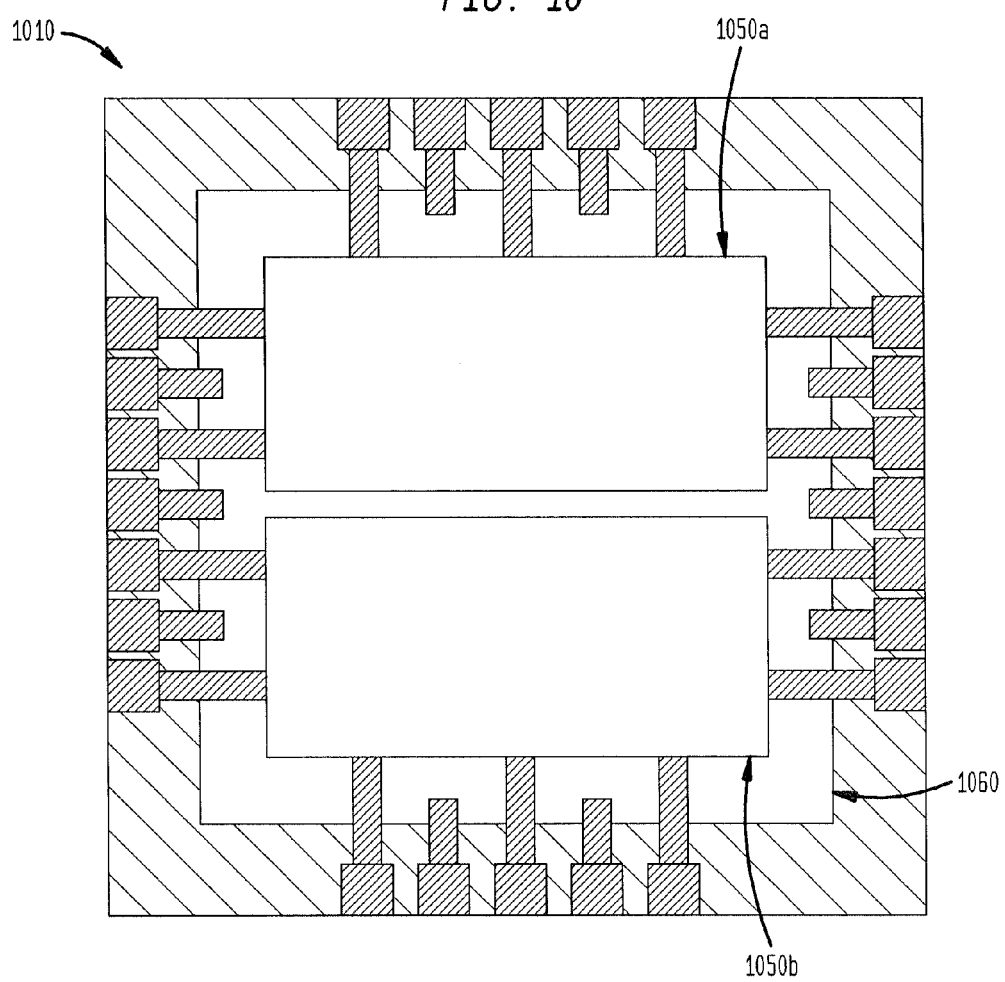
FIG. 10 is a diagrammatic side sectional view of a stacked microelectronic unit according to yet another embodiment.

FIG. 10 shows another variation of the embodiment described above with respect to FIGS. 1A through 5B. The microelectronic unit 1010 is the same as the microelectronic unit 10 described above, except that there are two first device chips 1050a and 1050b disposed adjacent one another within a single first recess 1021 extending below the first surface 1031 of the lead fingers 1025. Both of the first device chips 1050a and 1050b overlie a single second device chip 1060 disposed within a second recess 1022 extending below the second surface 1032 of the lead fingers 1025.

Figure 11A:
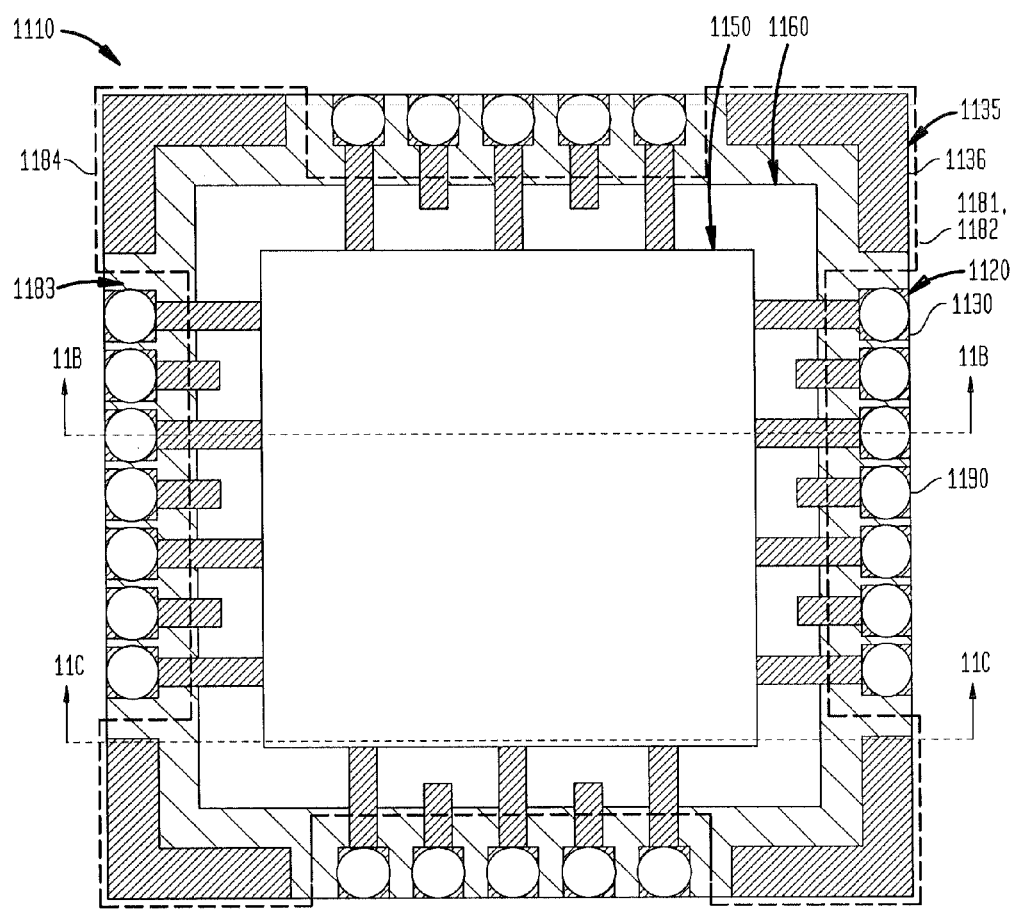
FIG. 11A is a diagrammatic side sectional view of a stacked microelectronic unit according to another embodiment.
Figure 11B:
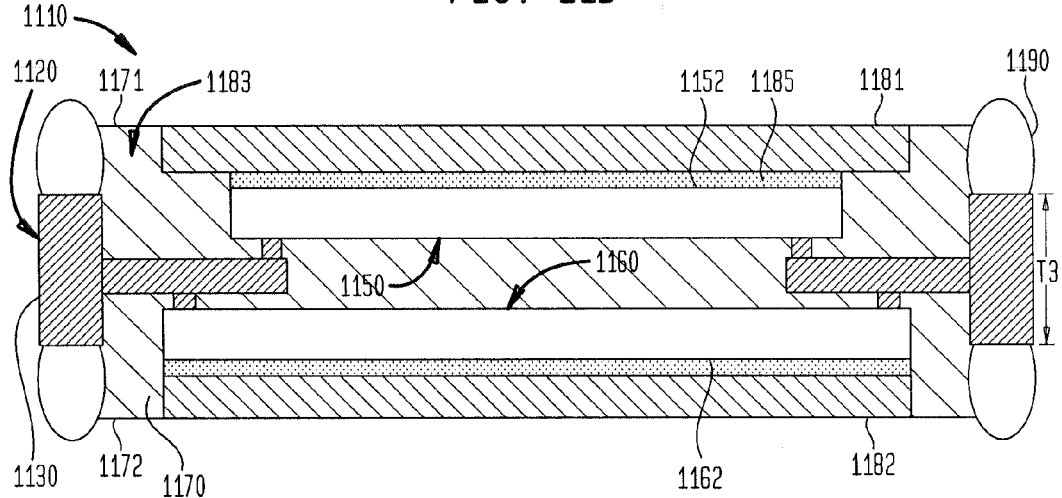
FIG. 11B is a diagrammatic side sectional view of the microelectronic unit of FIG. 11A, taken along the line 11B-11B of FIG. 11A.
Figure 11C:
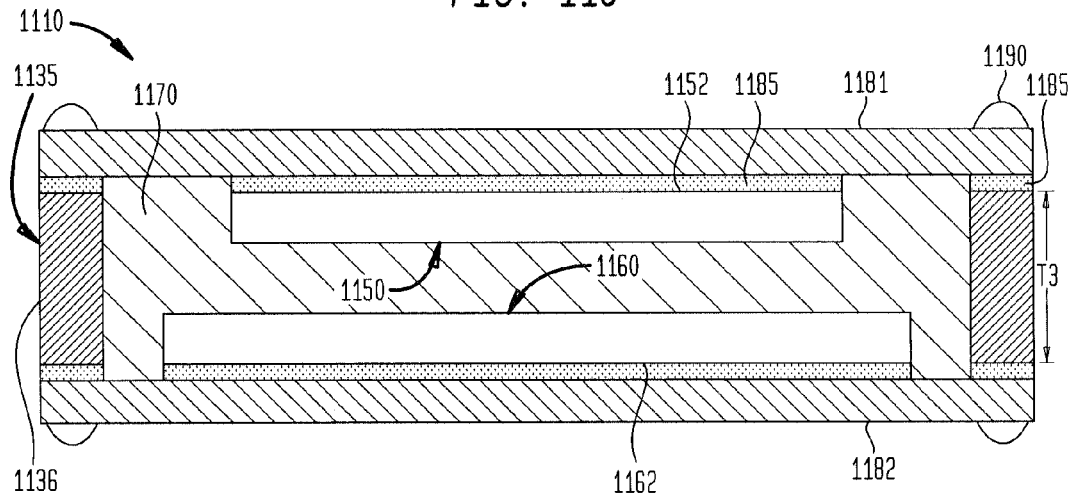
FIG. 11C is a diagrammatic side sectional view of the microelectronic unit of FIG. 11A, taken along the line 11C-11C of FIG. 11A.

FIGS. 11A-11C show yet another variation of the embodiment described above with respect to FIGS. 1A through 5B. The microelectronic unit 1110 is the same as the microelectronic unit 10 described above, except that the microelectronic unit 1110 includes horizontally-extending heat spreader elements 1181 and 1182, heat spreader connector elements 1135, and conductive masses 1190 for electrically connecting the microelectronic unit 1110 to one or more external components. Each of the heat spreader elements 1181, 1182 and the heat spreader connector elements 1135 can be made of metal or other thermally conductive material, or a combination of metal and another thermally conductive material. In one embodiment, the horizontally-extending heat spreader elements 1181 and 1182 can be formed from one or more metal sheets.

As can be seen in FIGS. 11B and 11C, the heat spreader connector elements 1135 (FIG. 11C) and the fan-out portions 1130 (FIG. 11B) can have the same thickness T3 in a first direction between the first and second surfaces 1131 and 1132 of the fan-out portions. The heat spreader connector elements 1135 and the fan-out portions 1130 can be formed from the same metal layer when fabricating the lead frame 1120 by patterning the metal layer according to a mask layer where it is desired to preserve remaining portions of the metal layer. In one example, the heat spreader connector elements 1135 can be peripheral heat spreader connector elements disposed at a periphery of the microelectronic unit 1110. In a particular embodiment, when the heat spreader connector elements 1135 are disposed at a periphery of the microelectronic unit 1110, outward-facing surfaces 1136 of the heat spreader connector elements can be exposed at the periphery of the microelectronic unit.

The heat spreader elements 1181 and 1182 can be disposed adjacent the respective first and second device chips 1150 and 1160. The heat spreader elements 1181 and 1182 can be joined to the respective first and second device chips 1150 and 1160 by thermally conductive material 1185 such as thermally conductive grease, thermally conductive adhesive, or solder. As shown in FIG. 11B, the rear surfaces 1152 and 1162 of the respective first and second device chips 1150 and 1160 can be exposed at a surface of the encapsulant 1170 for contact with the thermally conductive material 1185 or with the heat spreader elements 1181 and 1182. As shown in FIG. 11C, the heat spreader elements 1181 and 1182 can be joined with the heat spreader connector elements 1135 by portions of the thermally conductive material 1185.

The heat spreader elements 1181 and 1182 can have notches 1183 extending inward from an outer periphery 1184, so that portions of the first and second surfaces 1131 and 1132 of the fan-out portions 1130 can be exposed for interconnection with one or more external components. Conductive masses 1190 can be deposited onto portions of the first and second surfaces 1131 and 1132 that are exposed at the notches 1183.

In one example, one or more horizontally-extending heat spreader elements 1181 and 1182 can be included in the microelectronic unit 1110, while the heat spreader connector elements 1135 can be omitted. In another example, one or more heat spreader connector elements 1135 can be included in the microelectronic unit 1110, while the horizontally-extending heat spreader elements 1181 and 1182 can be omitted.

Figure 11D:
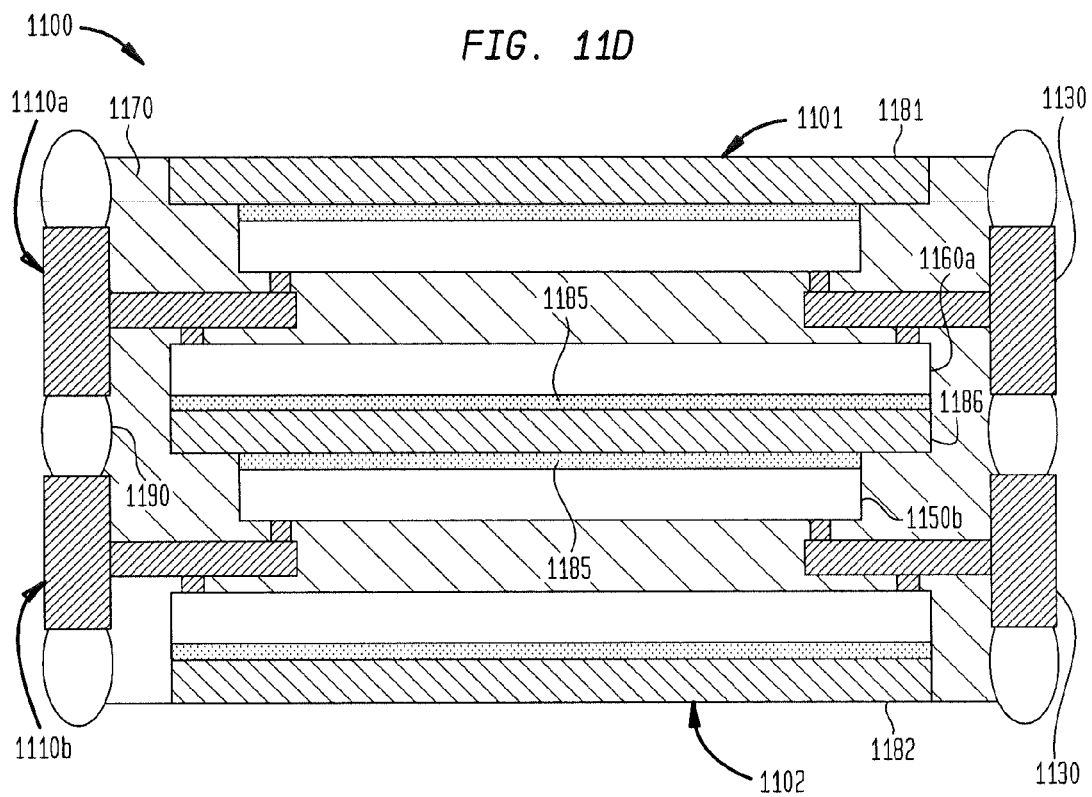
FIG. 11D is a stacked variation of the diagrammatic side sectional view shown in FIG. 11B.

FIG. 11D shows a stacked variation of the diagrammatic side sectional view shown in FIG. 11B. A microelectronic assembly 1100 can have stacked first and second microelectronic units 1110a and 1110b (collectively microelectronic units 1110). Conductive masses 1190 can be deposited onto exposed parts of the fan-out portions 1130 of the microelectronic units 1110 for joining the microelectronic units to one another. A horizontally-extending heat spreader element 1186 can be disposed adjacent the second device chip 1160a of the first microelectronic unit 1110a and adjacent the first device chip 1150b of the second microelectronic unit 1110b. The heat spreader element 1186 can be joined with the second device chip 1160a and the first device chip 1150b by thermally conductive material 1185.

Figure 12:
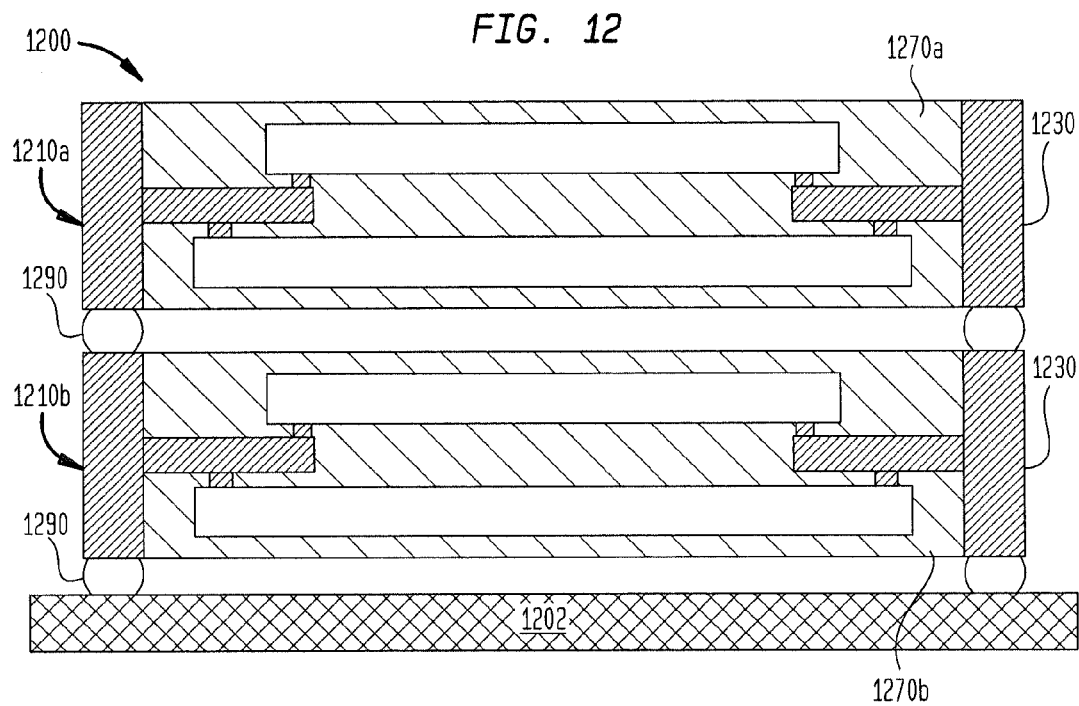
FIG. 12 is a diagrammatic side sectional view of a stacked microelectronic assembly according to another embodiment.

FIG. 12 shows a microelectronic assembly 1200 having stacked first and second microelectronic units 1210a and 1210b (collectively the microelectronic units 1210). The microelectronic units 1210 can be any of the microelectronic units described above with reference to FIGS. 1A through 11C. The microelectronic assembly 1200 includes a substrate 1202 that can be a circuit panel, for example. Conductive masses 1290 can be deposited onto exposed parts of the fan-out portions 1230 of the microelectronic units 1210 for joining the microelectronic units to one another and to the substrate 1202. In one example, the first microelectronic unit 1210a can at least partially overlie the second microelectronic unit 1210b. In a particular embodiment, one or more of the microelectronic units 1210 can include one or more heat spreader elements such as the horizontally-extending heat spreader elements 1181, 1182 and the heat spreader connector elements 1135 shown in FIGS. 11A-11C, and the microelectronic assembly 1200 can include one or more heat spreader elements disposed between adjacent microelectronic units 1210 such as the horizontally-extending heat spreader element 1186 shown in FIG. 11D.

In one embodiment of a microelectronic assembly 1200, each of a plurality of microelectronic units, e.g., the microelectronic units 1210a and 1210b, can be separately formed, each having a respective encapsulant 1270a and 1270b. In such an embodiment having a separately formed encapsulant for each microelectronic unit, a surface of a heat spreader element such as the heat spreader element 1181 or 1182 (FIGS. 11A-11C) can be exposed at at least one surface 1171, 1172 of each encapsulant 1170. Such microelectronic units 1110 can then be stacked and joined to one another, for example, in a configuration such as that shown in FIG. 12, to provide electrical and thermal communication between them.

In another embodiment, a plurality of microelectronic units, e.g., microelectronic units similar to the microelectronic units 1110a, 1110b (FIG. 11D) or the microelectronic units 1210a, 1210b (FIG. 12) but without encapsulations, can be electrically and thermally interconnected in a microelectronic assembly, and then an encapsulation such as the encapsulation 1170 can be formed that covers the microelectronic elements within the joined assembly, as shown in FIG. 11D, for example. Terminals at a top surface 1101, a bottom surface 1102, or both the top and bottom surfaces of such assembly can have conductive masses such as the conductive masses 1190 attached thereto. The terminals or the conductive masses may have at least portions exposed at such surface or surfaces of the assembly. The encapsulation can then cover remaining portions of the assembly that are not configured for electrical connection with one or more components external to the assembly.

Figure 13:
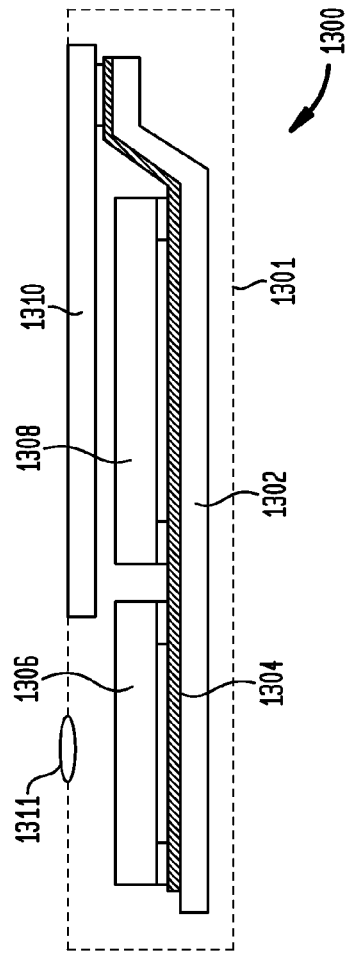
FIG. 13 is a schematic depiction of a system according to one embodiment including a plurality of modules.

The microelectronic units and lead frames described above with reference to FIGS. 1A through 10 can be utilized in construction of diverse electronic systems, such as the system 1300 shown in FIG. 13. For example, the system 1300 in accordance with a further embodiment of the invention includes a structure 1306 as described above in conjunction with other electronic components 1308 and 1310. The structure 1306 as described above may be, for example, a microelectronic unit 10 as discussed above in connection with FIGS. 1A and 1B, or a structure incorporating plural microelectronic units as discussed with reference to FIG. 12. In a further variant, both may be provided, and any number of such structures may be used.

In the exemplary system 1300 shown, the system can include a circuit panel or motherboard 1302 such as a flexible printed circuit board, and the circuit panel can include numerous conductors 1304, of which only one is depicted in FIG. 13, interconnecting the components with one another. However, this is merely exemplary; any suitable structure for making electrical connections can be used.

In a particular embodiment, the system 1300 can also include a processor such as the semiconductor chip 1308, such that each structure 1306 can be configured to transfer a number N of data bits in parallel in a clock cycle, and the processor can be configured to transfer a number M of data bits in parallel in a clock cycle, M being greater than or equal to N.

In the example depicted in FIG. 13, the component 1308 is a semiconductor chip and component 1310 is a display screen, but any other components can be used in the system 1300. Of course, although only two additional components 1308 and 1310 are depicted in FIG. 13 for clarity of illustration, the system 1300 can include any number of such components.

The structure 1306 and the components 1308 and 1310 can be mounted in a common housing 1301, schematically depicted in broken lines, and can be electrically interconnected with one another as necessary to form the desired circuit. The housing 1301 is depicted as a portable housing of the type usable, for example, in a cellular telephone or personal digital assistant, and screen 1310 can be exposed at the surface of the housing. In embodiments where a structure 1306 includes a light-sensitive element such as an imaging chip, a lens 1311 or other optical device also can be provided for routing light to the structure. Again, the simplified system shown in FIG. 13 is merely exemplary; other systems, including systems commonly regarded as fixed structures, such as desktop computers, routers and the like can be made using the structures discussed above.

A possible benefit of a module or component according to the invention, for example the module 10 described above with reference to FIGS. 1A and 1B, whereby a surface of the first device chip overlies at least a portion of the rear surface of the second device chip, can be to provide relatively short leads. Parasitic capacitance can be considerable between adjacent leads, particularly in microelectronic assemblies that have high contact density and fine pitch. In microelectronic assemblies such as the microelectronic unit 10 where the leads can be relatively short, parasitic capacitance can be reduced, particularly between adjacent leads.

Another possible benefit of a module or component according to the invention as described above can be to provide similar lengths of conductive leads, for example, which can electrically connect data input/output signal terminals with electrical contacts at the front surfaces of respective first and second device chips. In systems such as the system 1300 that can include a plurality of structures 1306, having relatively similar-length leads can allow the propagation delay for data input/output signals between each microelectronic element and exposed contacts to be relatively closely matched.

In any or all of the modules or components described in the foregoing, the rear surface of one or more of the first or second device chip can be at least partially exposed at an exterior surface of the microelectronic assembly after completing fabrication. Thus, in the assembly described above with respect to FIGS. 1A and 1B, one or both of the rear surfaces of the first and second device chips can be partially or fully exposed in the completed microelectronic unit. The rear surfaces can be partially or fully exposed although an overmold such as the encapsulant 70, or other encapsulating or packaging structures can contact or be disposed adjacent the microelectronic elements.

In any of the embodiments described above, the microelectronic assembly may include one or more heat spreaders made of metal, graphite or any other suitable thermally conductive material, such as the heat spreaders 1135, 1181, and 1182 shown in FIGS. 11A-11C.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic unit, comprising:
a lead frame having a plurality of monolithic lead fingers extending in a plane of the lead frame, each lead finger having a fan-out portion and a chip connection portion,
each fan-out portion extending in the lead frame plane, the fan-out portions having first and second opposed surfaces and a first thickness in a first direction between the opposed surfaces,
each chip connection portion extending in the lead frame plane, the chip connection portions having a second thickness smaller than the first thickness, the chip connection portions defining a first recess below the first surface and a second recess below the second surface;
a first device chip having a plurality of at least one of passive devices or active devices, having contacts thereon facing the chip connection portions and electrically coupled thereto, wherein at least a portion of a thickness of the first device chip extends within the first recess; and
a second device chip overlying and electrically coupled with the first device chip through electrical interconnections extending at least one of along or within the first and second device chips, wherein at least a portion of a thickness of the second device chip extends within the second recess.

2. A microelectronic unit as claimed in claim 1, wherein each chip connection portion has a first width in a second direction substantially parallel to the lead frame plane and each fan-out portion has a second width in the second direction, the first width being less than the second width.

3. A microelectronic unit as claimed in claim 1, wherein the first device chip embodies a plurality of active semiconductor devices therein.

4. A microelectronic unit as claimed in claim 1, wherein the first device chip has a plurality of passive devices, the passive devices including at least one of capacitors, inductors, or resistors.

5. A microelectronic unit as claimed in claim 1, wherein the fan-out portions are disposed beyond an exterior periphery of the first device chip.

6. A microelectronic unit as claimed in claim 1, wherein the entire thickness of the first device chip extends within the recess.

7. A microelectronic unit as claimed in claim 1, wherein a rear surface of the first device chip is exposed at an exterior surface of the microelectronic unit.

8. A microelectronic unit as claimed in claim 1, further comprising an encapsulant covering the chip connection portions and at least a portion of the first device chip.

9. A microelectronic unit as claimed in claim 1, wherein the contacts of the first device chip are joined to the chip connection portions by metal pillars extending therebetween.

10. A microelectronic unit as claimed in claim 1, wherein the contacts of the first device chip are joined to the chip connection portions by solder extending therebetween.

11. A microelectronic unit as claimed in claim 1, wherein the contacts of the first device chip are joined to the chip connection portions by a conductive matrix material extending therebetween.

12. A microelectronic unit as claimed in claim 1, further comprising a heat spreader element in thermally conductive contact with at least one of the first device chip and the lead frame.

13. A microelectronic unit as claimed in claim 12, wherein the heat spreader element is in thermally conductive contact with the first device chip.

14. A microelectronic unit as claimed in claim 12, wherein the heat spreader element overlies the first device chip and is disposed adjacent the first device chip.

15. A microelectronic unit as claimed in claim 1, further comprising a heat spreader connector element disposed beyond an exterior periphery of the first device chip.

16. A microelectronic unit as claimed in claim 1, wherein the second device chip entirely overlies the first device chip.

17. A microelectronic unit as claimed in claim 1, wherein a peripheral edge of the first device chip is offset from a peripheral edge of the second device chip.

18. A microelectronic unit as claimed in claim 1, further comprising a third device chip adjacent to the first device chip and overlying at least a portion of the second device chip, at least a portion of a thickness of the third device chip extending within the first recess.

19. A microelectronic unit as claimed in claim 1, wherein some of the chip connection portions are joined with the contacts of the first device chip and some of the chip connection portions are joined with contacts of the second device chip.

20. A microelectronic unit as claimed in claim 1, wherein some of the chip connection portions are joined with the contacts of both the first and second device chips.

21. A microelectronic unit as claimed in claim 1, wherein the chip connection portions that are joined with the contacts of the first device chip are longer than the chip connection portions that are joined with the contacts of the second device chip.

22. A microelectronic unit as claimed in claim 21, wherein connections between the contacts of the first and second device chips and the chip connection portions are offset in a second direction in which the chip connection portions extend towards the respective fan-out portions.

23. A microelectronic unit as claimed in claim 1, further comprising a heat spreader element in thermally conductive contact with at least one of the first and second device chips.

24. A microelectronic assembly including first and second microelectronic units, each microelectronic unit as claimed in claim 1, the first microelectronic unit electrically connected with and at least partially overlying the second microelectronic unit.

25. A microelectronic assembly as claimed in claim 24, wherein the fan-out portions of the lead fingers connected to the first microelectronic unit are joined to the fan-out portions of the lead fingers connected to the second microelectronic unit.

26. A microelectronic assembly as claimed in claim 24, further comprising a heat spreader element disposed between the second device chip of the first microelectronic unit and the first device chip of the second microelectronic unit.

27. A microelectronic assembly as claimed in claim 24, further comprising an encapsulant covering the chip connection portions and at least portions of the device chips of the first and second microelectronic units.

28. A system comprising a structure according to claim 1 and one or more other electronic components electrically connected to the structure.

29. A system as claimed in claim 28, further comprising a housing, said structure and said other electronic components being mounted to said housing.

30. A method of fabricating a microelectronic assembly, comprising joining first and second microelectronic units as claimed in claim 1, the first microelectronic unit electrically connected with and at least partially overlying the second microelectronic unit.

31. A method as claimed in claim 30, further comprising depositing an encapsulant covering the chip connection portions and at least portions of the device chips of the first and second microelectronic units.

32. A method of fabricating a microelectronic assembly, comprising joining the fan-out portions of a microelectronic unit as claimed in claim 1 with corresponding contacts of at least a first component confronting the first surface of the lead frame.

33. A lead frame, comprising:
a plurality of monolithic lead fingers extending in a plane of the lead frame, each lead finger having a fan-out portion and a chip connection portion,
each fan-out portion extending in the lead frame plane, the fan-out portions having first and second opposed surfaces and a first thickness in a first direction between the opposed surfaces,
each chip connection portion extending in the lead frame plane, the chip connection portions having a second thickness smaller than the first thickness, the chip connection portions defining a first recess below the first surface and a second recess below the second surface, the chip connection portions including first and second subsets of chip connection portions, the first subset being longer than the second subset.

34. A lead frame as claimed in claim 33, wherein each chip connection portion has a first width in a second direction substantially parallel to the lead frame plane and each fan-out portion has a second width in the second direction, the first width being less than the second width.

35. A lead frame, comprising:
a plurality of monolithic lead fingers extending in a plane of the lead frame, each lead finger having a fan-out portion and a chip connection portion,
each fan-out portion extending in the lead frame plane, the fan-out portions having first and second opposed surfaces and a first thickness in a first direction between the opposed surfaces,
each chip connection portion extending in the lead frame plane, the chip connection portions having a second thickness smaller than the first thickness, the chip connection portions defining a recess below the first surface,
wherein the chip connection portions have bumps integral therewith projecting in the first direction from the chip connection portions, the chip connection portions and the bumps being formed of the same material.

36. A method of fabricating a lead frame, comprising:
removing material from a metal element to form a plurality of monolithic lead fingers extending in a plane of the metal element,
the lead fingers having fan-out portions and chip connection portions extending from the fan-out portions, the fan-out portions having first and second opposed surfaces and a first thickness in a first direction between the opposed surfaces, and the chip connection portions having a second thickness in the first direction, the second thickness smaller than the first thickness, and the chip connection portions defining a first recess below the first surface and a second recess below the second surface, the chip connection portions including first and second subsets of chip connection portions, the first subset being longer than the second subset.

37. A method as claimed in claim 36, wherein the step of removing material includes removing material from the first surface to define locations of the lead fingers, and further removing material from the metal element to define the fan-out portions at the defined lead finger locations and to define the chip connection portions.

38. A method of fabricating a lead frame, comprising:
removing material from a metal element to form a plurality of monolithic lead fingers extending in a plane of the metal element,
the lead fingers having fan-out portions and chip connection portions extending from the fan-out portions,
the fan-out portions having first and second opposed surfaces and a first thickness in a first direction between the opposed surfaces, and
the chip connection portions having a second thickness in the first direction, the second thickness smaller than the first thickness and defining a recess below the first surface,
wherein the step of removing material forms the chip connection portions having bumps integral therewith projecting in the first direction from the chip connection portions, the chip connection portions and the bumps being formed of the same material.

39. A method as claimed in claim 38, further comprising plating a metal onto the bumps for joining with conductive contacts of a device chip, the metal selected from the group consisting of: gold, nickel, palladium, tin, or an alloy of any of these metals.

40. A method of fabricating a microelectronic unit, comprising:
joining contacts of a first device chip with chip connection portions of lead fingers of a lead frame, the first device chip having a plurality of at least one of passive devices or active devices, the contacts of the first device chip facing the chip connection portions; and
joining contacts of a second device chip with the chip connection portions of the lead fingers of the lead frame,
wherein at least a portion of a thickness of the first device chip extends within a first recess defined by the chip connection portions, and at least a portion of a thickness of the second device chip extends within a second recess defined by the chip connection portions,
wherein the lead fingers further include fan-out portions extending in a lead frame plane from the chip connection portions, the fan-out portions having first and second opposed surfaces, the first recess extending below the first surface and the second recess extending below the second surface, and wherein the fan-out portions have a first thickness in a first direction between the opposed surfaces, and the chip connection portions have a second thickness in the first direction smaller than the first thickness.

41. A method as claimed in claim 40, wherein each chip connection portion has a first width in a second direction substantially parallel to the lead frame plane and each fan-out portion has a second width in the second direction, the first width being less than the second width.

42. A method as claimed in claim 40, wherein the fan-out portions are disposed beyond an exterior periphery of the first device chip.

43. A method as claimed in claim 40, wherein the entire thickness of the first device chip extends within the first recess.

44. A method as claimed in claim 40, wherein a rear surface of the first device chip is exposed at an exterior surface of the microelectronic unit.

45. A method as claimed in claim 40, further comprising depositing an encapsulant covering the chip connection portions of the lead fingers and at least a portion of the first device chip.

46. A method as claimed in claim 40, wherein the step of joining the contacts of the first device chip with the chip connection portions is performed by thermosonic bonding of the chip connection portions to metal pillars extending from the contacts of the first device chip.

47. A method as claimed in claim 40, wherein the step of joining contacts of the first device chip with the chip connection portions is performed by curing a conductive matrix material extending between the contacts of the first device chip and the chip connection portions.

48. A method as claimed in claim 40, further comprising joining a heat spreader element to the first device chip with a thermally conductive material, the heat spreader element at least partially overlying the first device chip.

49. A method as claimed in claim 40, wherein a peripheral edge of the first chip is offset from a peripheral edge of the second chip.

50. A method as claimed in claim 49, wherein connections between the contacts of the first and second device chips and the chip connection portions are offset in a second direction in which the chip connection portions extend towards the respective fan-out portions.

51. A method as claimed in claim 40, wherein some of the chip connection portions are joined with the contacts of the first device chip and some of the chip connection portions are joined with contacts of the second device chip.

52. A method as claimed in claim 51, wherein some of the chip connection portions are joined with the contacts of both the first and second device chips. joined with the contacts of the second device chip.

53. A method as claimed in claim 40, wherein the chip connection portions that are joined with the contacts of the first device chip are longer than the chip connection portions that are joined with the contacts of the second device chip.

* * * * *